(12) United States Patent
Hellgren

(10) Patent No.: US 11,953,558 B2
(45) Date of Patent: Apr. 9, 2024

(54) METHOD AND SYSTEM FOR ESTIMATING THE STATE-OF-HEALTH OF A BATTERY

(71) Applicant: VOLVO TRUCK CORPORATION, Gothenburg (SE)

(72) Inventor: Jonas Hellgren, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 584 days.

(21) Appl. No.: 17/276,305

(22) PCT Filed: Sep. 17, 2018

(86) PCT No.: PCT/EP2018/075019
§ 371 (c)(1),
(2) Date: Mar. 15, 2021

(87) PCT Pub. No.: WO2020/057715
PCT Pub. Date: Mar. 26, 2020

(65) Prior Publication Data
US 2021/0263109 A1 Aug. 26, 2021

(51) Int. Cl.
*G01R 31/392* (2019.01)
*G01R 31/389* (2019.01)
*H01M 10/48* (2006.01)

(52) U.S. Cl.
CPC ......... *G01R 31/392* (2019.01); *G01R 31/389* (2019.01); *H01M 10/482* (2013.01); *H01M 10/486* (2013.01); *H01M 2220/20* (2013.01)

(58) Field of Classification Search
CPC .. H01M 10/48; H01M 10/482; H01M 10/486; H01M 10/633; H01M 2220/20;
(Continued)

(56) References Cited

U.S. PATENT DOCUMENTS

2012/0041698 A1 2/2012 Zhang et al.
2013/0185008 A1 7/2013 Itabashi et al.
(Continued)

FOREIGN PATENT DOCUMENTS

CN 103308864 A 9/2013
CN 103558554 A 2/2014
(Continued)

OTHER PUBLICATIONS

KR20100063344 English translation. Sung et al. Korea. Jun. 11, 2010 (Year: 2010).*
(Continued)

*Primary Examiner* — Christopher P Domone
(74) *Attorney, Agent, or Firm* — Venable LLP; Jeffri A. Kaminski

(57) ABSTRACT

A method and system for estimating the state-of-health of a battery The invention relates to a method for estimating the state-of-health, $SoH_{est}$, of a battery in a vehicle, the method comprising: determining (100) a first battery property and a battery temperature of a battery in a vehicle; calculating (102) a state-of-health, $SoH_{calc}$, of a battery cell based on the determined first battery property using a predetermined model; providing (104) a function f estimating a battery cell degradation rate; updating (106) a state-of health estimated in a previous time step according to $SoH_{est} \leftarrow SoH_{est} + f \cdot dt + K \cdot (SoH_{calc} - SoH_{est})$, where K is a gain factor which is dependent on operating conditions of the vehicle, and wherein K is modified (108) for each time step using a reinforcement learning agent.

15 Claims, 2 Drawing Sheets

(58) Field of Classification Search
CPC ......... H01M 2010/4271; G01R 31/392; G01R 31/389
See application file for complete search history.

(56) References Cited

U.S. PATENT DOCUMENTS

| | | | |
|---|---|---|---|
| 2016/0084913 A1 | 3/2016 | Lupo et al. | |
| 2017/0205469 A1 | 7/2017 | Song et al. | |
| 2018/0100898 A1* | 4/2018 | Benosman | B60L 58/15 |

FOREIGN PATENT DOCUMENTS

| | | | |
|---|---|---|---|
| CN | 103728564 A | | 4/2014 |
| CN | 103823188 A | | 5/2014 |
| CN | 108037462 A | | 5/2018 |
| CN | 108258338 A | | 7/2018 |
| KR | 20100063343 A | | 6/2010 |
| KR | 20100063344 | * | 6/2010 |

OTHER PUBLICATIONS

King Zhang et al: "An intelligent energy allocation method for hybrid energy storage systems for electrified vehicles", PhD Thesis, Jun. 4, 2018, pp. 1-163.

Lin Xue et al: "Machine learning-based energy management in a hybrid electric vehicle to minimize total operating cost", Nov. 2, 2015, pp. 627-634.

International Search Report and Written Opinion dated Jul. 1, 2019 in corresponding International PCT Application No. PCT/EP2018/075019, 10 pages.

Jiangbo Liu, "Research on the state-of-health estimation of lithium batteries based on internal resistance detection," and "Chinese Master's Theses Full-text Database Engineering Science and Technology II," No. 01, pp. C042-C1315, Jan. 15, 2015, 15 pages.

Chinese Office Action and Search Report, dated Oct. 26, 2023, in corresponding Chinese Application No. 201880097504.6, 19 pages.

* cited by examiner

METHOD AND SYSTEM FOR ESTIMATING THE STATE-OF-HEALTH OF A BATTERY

CROSS-REFERENCE TO RELATED APPLICATIONS

This application is a U.S. National Stage application of PCT/EP2018/075019, filed Sep. 17, 2018, and published on Mar. 26, 2020, as WO 2020/057715 A1, all of which is hereby incorporated by reference in its entirety.

TECHNICAL FIELD

The invention relates to a method and system for state-of-health estimation of a battery in a vehicle.

The invention can be applied in heavy-duty vehicles, such as trucks, buses and construction equipment. Although the invention will be described with respect to a truck, the invention is not restricted to this particular vehicle, but may also be used in other vehicles.

BACKGROUND

In a hybrid or electric vehicle, it is important to have a good knowledge of battery properties for various operating conditions. To achieve that, an electric vehicle often comprises a battery management system tasked with monitoring the status of the battery.

In particular, objectives of the battery management system are (1), energy level state monitoring, i.e. state of charge estimation (2), power capacity state monitoring (3), maintaining of safe operation of the battery pack (4), state of health estimation and (5) ensuring that the cells in the battery pack are balanced. Sensor signals, such as voltage, current and temperature, are combined with mathematical models to achieve the previously listed objectives. The mathematical models include parameters describing cell properties such as for example resistance, capacity and open circuit voltage. Setting of these parameters is essential for efficient state monitoring. Typically laboratory measurements are performed to determine the relationship between various battery parameters an external parameters such as temperature.

However, the properties of battery cells vary between cells and also over time. The reasons for the variation may be production related and the cell properties change over time due to degradation of the battery cell, where the change may be different in different battery cells.

Due to the electrification currently occurring in the automotive industry, it is increasingly important to be able to accurately determine a state-of-health (SoH) of a battery. The state-of-health is for example needed for ownership cost evaluation and to determine the rest value of a battery system. However, the state-of-health is dependent on multiple operating conditions. Accordingly, the state-of-health can be assumed to vary with for example temperature.

Accordingly, there is a need for a system and a method for accurately estimating the state-of-health of a battery in a vehicle.

SUMMARY

An object of the invention is to provide a method and system for estimating the state-of-health of a battery in a vehicle.

According to a first aspect of the invention, there is provided a method for estimating the state-of-health, $SoH_{est}$, of a battery in a vehicle. The method comprises: determining a first battery property and a battery temperature of a battery in a vehicle; calculating a state-of-health, $SoH_{calc}$, of a battery cell for the determined first battery property using a predetermined model; providing a function $f$ estimating a battery cell degradation rate; updating a state-of health estimated in a previous time step according to $$SoH_{est} \leftarrow SoH_{est} + f \cdot dt + K \cdot (SoH_{calc} - SoH_{est}),$$

where K is a gain factor which is a dependent on operating conditions of the vehicle, and wherein K is modified for each time step using a reinforcement learning agent.

In a vehicle battery, it can be assumed that battery measurements are performed continuously to determine various properties of the battery for changing operating conditions. The described relation for estimating the state-of-health can be seen as an observer filter where the function $f$ expresses an estimation of the cell degradation rate, normally related to for example the power load of the battery. However, inaccuracy of this measure will in the long term result in a drifting SoH estimation. Therefore a correction term $K \cdot (SoH_{calc} - SoH_{est})$ is needed.

The predetermined model used can be used for calculating a state-of-health for a determined battery property. A problem is however present, and that is that the model describing $SoH_{calc}$ in relation to a battery property is dependent on a range of operating conditions, in particular temperature. If the temperature is decreased, the internal resistance is normally increased. Furthermore, the model describing SoH does not cover all combinations of operating conditions. The model may for example be determined for a limited number of specific temperatures. The problem at hand thereby becomes to set a proper filter gain K, and the present invention is based on the realization that K is advantageously set using a reinforcement learning agent. Reinforcement learning is a topic in the filed of machine learning where for an observed state, the agent takes an action with the aim of maximizing a reward. In the present context, the reward is to minimize the estimation error of the battery state-of-health. An advantage of using a reinforcement learning agent is that the value of K may change in relatively large steps which is not easily handled by a conventional Kalman filter.

To determine the overall state-of-health of the battery, it may be desirable to determine the state-of-health for a plurality of battery cells to properly account for variations between battery cells.

According to one embodiment of the invention, the function $f$ is a function of the power provided by the battery. It is known that a higher power output from the battery increases the battery degradation rate. Moreover, the function $f$ may also depend on the state-of-charge and battery temperature, which may also influence the degradation rate of the battery. For example, battery degradation may be higher at low temperatures and/or at low state-of-charge.

According to one embodiment of the invention, the determined battery property is battery resistance. The determined battery property may also be another slowly changing parameter describing the battery, such as battery capacity. The relation between slowly varying battery properties and the battery State of Health can be determined "offline", e.g. in a test laboratory, for certain temperatures and operating conditions.

According to one embodiment of the invention, the gain factor K is a function of the battery temperature. Thereby, a more accurate setting of the gain factor K can be achieved since the setting can be adapted to current operating conditions, and in particular to the battery temperature.

According to one embodiment of the invention, the gain factor K is controlled by a predetermined policy defining if K is increased, decreased or kept constant for a given temperature. The policy may advantageously be determined in a laboratory environment where it can be defined how the value of K should change depending on the current operating condition.

According to one embodiment of the invention, the predetermined policy may be a predefined table defining if K should be increased, decreased or kept constant for a given temperature, and for a specific value of K in a previous estimation step. The amount by which K should increase or decrease is likewise predetermined and included in the policy. It should however be noted that other methods of determining and updating a value of K may be used. The reinforcement learning agent used to modify the value of K may for example be based on so called continuous action reinforcement learning.

According to one embodiment of the invention, the predetermined model for calculating the state-of-health is selected based on the battery temperature. This means that there may be separate model describing the relation between state-of-health and the determined battery property, such as resistance, which in turn may lead to a more accurate calculation of a state-of-health value.

According to one embodiment of the invention, a first value of the estimated state-of-health for a battery is advantageously set to 1. Thereby, it is assumed that the battery is at full health when the method is performed for the first time on a specific battery. The estimated state-of-health is thus saved and updated continuously throughout the lifetime of the battery. It is of course also possible to set the starting state-of-health to any value.

According to one embodiment of the invention, the predetermined model used to calculate the state-of-health, $SoH_{calc}$, is based on a cell model of the battery. A cell model can in general give an accurate description of a battery property such as the state-of-health for a specific set of operating conditions. However, the cell model may not accurately describe the battery properties for all operating temperatures, thereby giving rise to the need for the method described in the present disclosure.

According to one embodiment of the invention, the method may further comprise performing an update of the estimated state-of-health at an interval in the range of 1 to 10 minutes. The described time interval is considered to be sufficient since the state-of-health of the battery is a slowly changing parameter. It is also possible to perform a state-of-health estimation if certain conditions are fulfilled. Such a condition may for example be a high power output from the battery, or other operating conditions considered to have a larger influence on the state-of-health.

There is also provided a computer program comprising program code means for performing the steps of any of the above described embodiments if the program is run on a computer, and a computer readable medium carrying a computer program comprising program code means for performing the steps of the method when the program product is run on a computer.

According to a second aspect of the invention, there is provided a battery system comprising a battery comprising a plurality of battery cells and a battery control unit. The battery control unit is configured to: determine a first battery property and a battery temperature of a battery in a vehicle; calculate a state-of-health, $SoH_{calc}$, of a battery cell for the determined first battery property using a predetermined model; provide a function $f$ estimating a battery cell degradation rate; update a state-of health estimated in a previous time step according to $SoH_{est} \leftarrow SoH_{est} + f \cdot dt + K \cdot (SoH_{calc} - SoH_{est})$, where K is a gain factor which is a dependent on operating conditions of the vehicle, and wherein K is modified for each time step using a reinforcement learning agent.

Effects and features of this second aspect of the present invention are largely analogous to those described above in connection with the first aspect of the invention.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Figure 1:
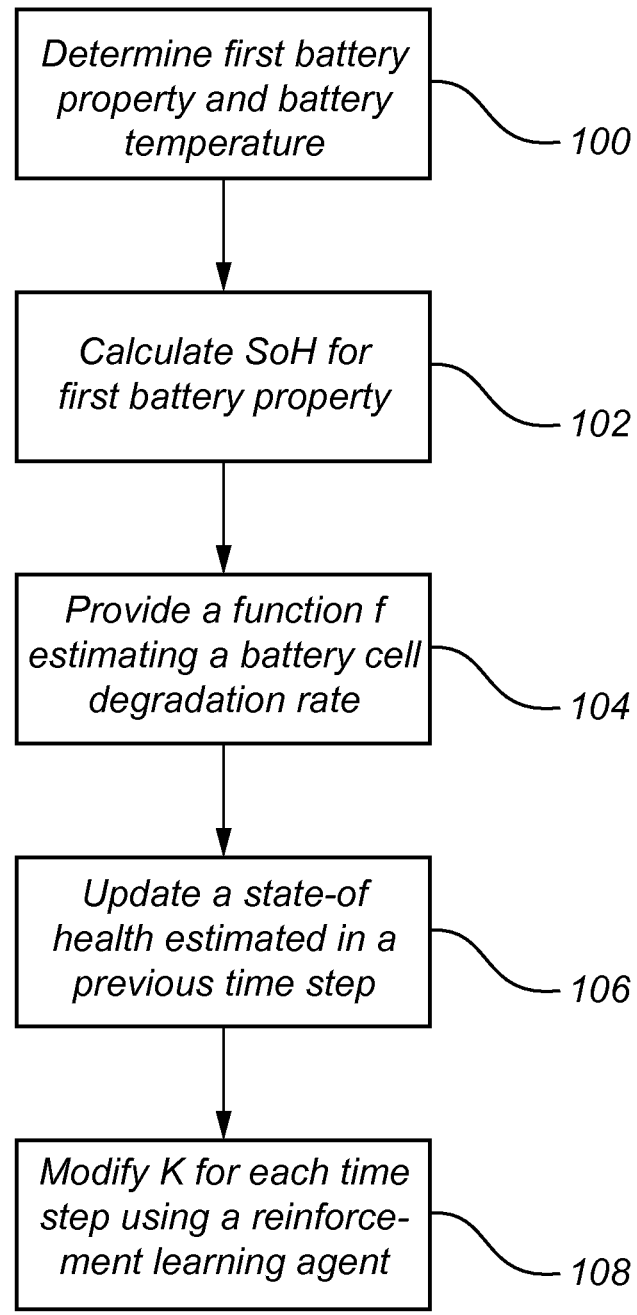
FIG. 1 is a flow chart outlining general steps of a method according to an embodiment of the invention.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

FIG. 1 is a flow chart outlining general steps of a method according to an embodiment of the invention. The method for estimating the state-of-health, $SoH_{est}$, of a battery in a vehicle first comprises the step of determining 100 a first battery property and a battery temperature of a battery in a vehicle. The first battery property may for example be the battery resistance or battery capacity.

Next, a state-of-health, $SoH_{calc}$, of a battery cell is calculated 102 for the determined first battery property using a predetermined model, and a function $f$ estimating a battery cell degradation rate is provided 104. The function $f$ may be a function of the power provided by the battery since battery power output is known to influence the degradation of the battery.

In the following steps, a state-of health estimated in a previous time step is updating 106 according to:

$$SoH_{est} \leftarrow SoH_{est} + f \cdot dt + K \cdot (SoH_{calc} - SoH_{est})$$

where K is a gain factor which is dependent on operating conditions of the vehicle, and wherein K is modified 108 for each time step using a reinforcement learning agent. If the battery is new or of no previous estimations of the state of health are available, $SoH_{est}$ may be set to 1. It is also possible to use another value as the initial $SoH_{est}$ if no previous estimation is available.

However, the filter updating sample time dt is not necessarily constant. The sampling may be based on the loading current of the battery which can be more or less stochastic. The method may for example comprise triggering a sampling and an update of the estimated state of health based on certain conditions of the current from the battery, such as when the current reaches above a certain threshold of the changes in current are larger than a fixed criterion.

A straightforward model $f$ estimating a battery cell degradation rate may be formulated as:

$$f = \frac{|P_{battery}|}{E_{battery} \cdot n_{cyclife}}$$

where $P_{battery}$ is the power drawn from the battery, $E_{battery}$ is the battery energy capability and $n_{cyclife}$ is an estimated number of charging cycles that can be managed by the battery during the battery lifetime. Moreover, $n_{cyclife}$ may be defined as function of the power drawn from the battery since a higher power outtake in general results in a shorter life length of the battery.

To more accurately estimate the state-of-health for the battery as a whole, it is preferable to estimate the state-of-health for a plurality of cells in a battery pack to properly account for variations between the battery cells of a battery.

Table 1 below illustrates an example predetermined policy for updating the gain factor K for different temperatures with the following parameters; I=Increase, K=Keep, and D=Decrease. The parameters of Table 1 can be determined in a controlled laboratory environment where the behaviour of a battery cell can be determined for different temperatures. For example, for a temperature of 20° C., the predetermined policy dictates that the value of K should go towards 0.2, which is a "Keep-value".

TABLE 1

| T\K | 0 | 0.1 | 0.2 | 0.3 | 0.4 | 0.5 | 0.6 | 0.7 | 0.8 |
|---|---|---|---|---|---|---|---|---|---|
| 30 | I | K | D | D | D | D | D | D | D |
| 20 | I | I | K | D | D | D | D | D | D |
| 10 | K | D | D | D | D | D | D | D | D |
| 0 | K | D | D | D | D | D | D | D | D |

Figure 2:
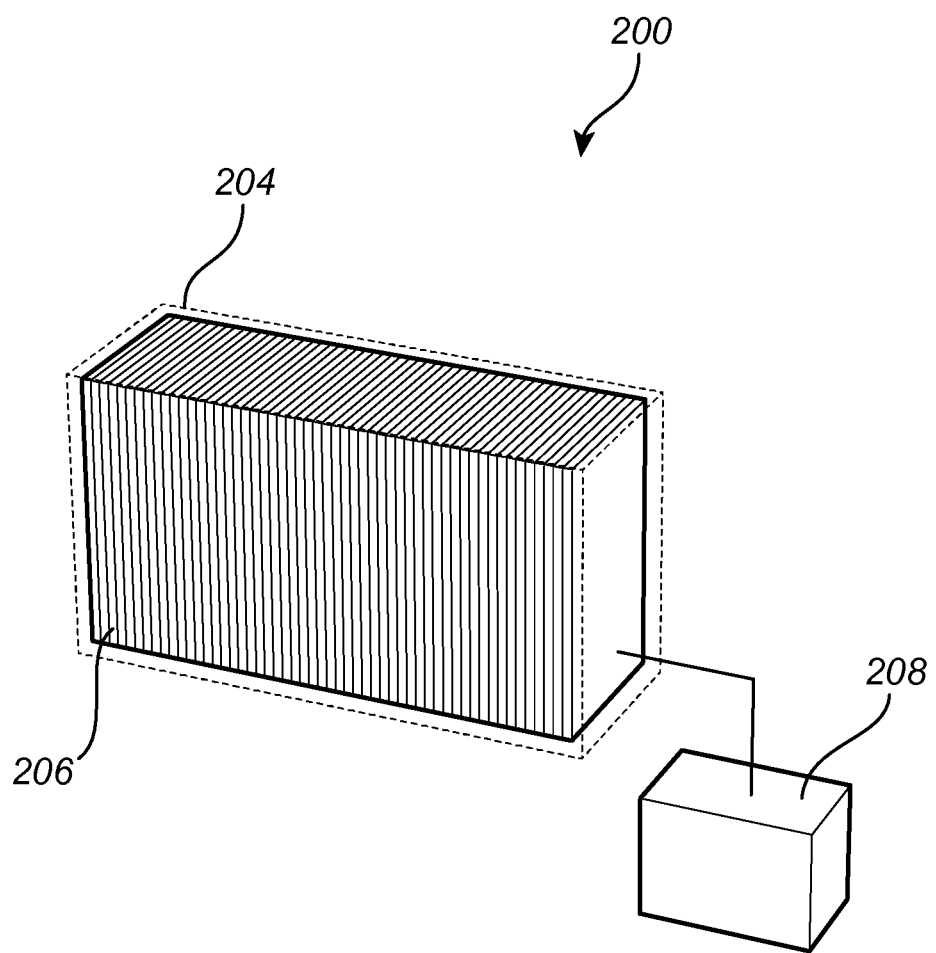
FIG. 2 schematically illustrates a system according to an embodiment of the invention.

FIG. 2 schematically illustrates a battery system 200 comprising a battery 204 in turn comprising a plurality of battery cells 206 and a battery control unit 208. The control unit 208 may include a microprocessor, microcontroller, programmable digital signal processor or another programmable device. The control unit 208 may also, or instead, include an application specific integrated circuit, a programmable gate array or programmable array logic, a programmable logic device, or a digital signal processor. Where the control unit 208 includes a programmable device such as the microprocessor, microcontroller or programmable digital signal processor mentioned above, the processor may further include computer executable code that controls operation of the programmable device.

The battery control unit 208 is configured to: measure a first battery property and a battery temperature of a battery in a vehicle; calculate a state-of-health, $SoH_{calc}$, of a battery cell for the determined battery property using a predetermined model; provide a function $f$ estimating a battery cell degradation rate; update a state-of health estimated in a previous time step according to $$SoH_{est} \leftarrow SoH_{est} + f \cdot dt + K \cdot (SoH_{calc} - SoH_{est}),$$

where K is a gain factor which is a dependent on operating conditions of the vehicle, and wherein K is modified for each time step using a reinforcement learning agent.

It is to be understood that the present invention is not limited to the embodiments described above and illustrated in the drawings; rather, the skilled person will recognize that many changes and modifications may be made within the scope of the appended claims.

The invention claimed is:

1. A method for estimating the state-of-health, $SoH_{est}$, of a battery in a vehicle, the method comprising:
   determining a first battery property and a battery temperature of a battery in a vehicle;
   calculating a state-of-health, $SoH_{calc}$, of a battery cell based on the determined first battery property using a predetermined model;
   providing a function $f$ estimating a battery cell degradation rate;
   updating a state-of health estimated in a previous time step according to $$SoH_{est} \leftarrow SoH_{est} + f \cdot dt + K \cdot (SoH_{calc} - SoH_{est}),$$

where K is a gain factor which is dependent on operating conditions of the vehicle, and wherein K is modified for each time step using a reinforcement learning agent.

2. The method according to claim 1, wherein the function $f$ is a function of the power provided by the battery.

3. The method according to claim 1, wherein the determined first battery property is battery resistance.

4. The method according to claim 1, wherein the gain factor K is a function of the battery temperature.

5. The method according to claim 1, wherein the gain factor K is a controlled by a predetermined policy defining if K is increased, decreased or kept constant for a given temperature.

6. The method according to claim 5, wherein the predetermined policy is a predefined table defining if K is increased, decreased or kept constant for a given temperature.

7. The method according to claim 1, wherein the predetermined model for calculating the state of health is selected based on the battery temperature.

8. The method according to claim 1, wherein a first value of the estimated state-of-health for a battery is set to 1.

9. The method according to claim 1, wherein the predetermined model used to calculate the state-of-health, $SoH_{calc}$, is based on a cell model of the battery.

10. The method according to claim 1, further comprising performing an update of the estimated state-of-health at an interval in the range of 1 to 10 minutes.

11. A computer program comprising program code means for performing the steps of claim 1 when the program is run on a computer.

12. A computer readable medium carrying a computer program comprising program code means for performing the steps of claim 1 when the program product is run on a computer.

13. A battery system comprising a battery comprising a plurality of battery cells and a battery control unit, where the battery control unit is configured to:
   measure a first battery property and a battery temperature of a battery in a vehicle;
   calculate a state-of-health, $SoH_{calc}$, of a battery cell for the determined battery property using a predetermined model;
   provide a function $f$ estimating a battery cell degradation rate;
   update a state-of health estimated in a previous time step according to $$SoH_{est} \leftarrow SoH_{est} + f \cdot dt + K \cdot (SoH_{calc} - SoH_{est}),$$

where K is a gain factor which is a dependent on operating conditions of the vehicle, and wherein K is modified for each time step using a reinforcement learning agent.

14. The battery system according to claim 13, wherein the gain factor K is a controlled by a predetermined policy defining if K is increased, decreased or kept constant for a given temperature.

15. A vehicle comprising a battery system according to claim 13.

* * * * *